March 20, 1973 A. E. BLAKESLEE 3,721,583

VAPOR PHASE EPITAXIAL DEPOSITION PROCESS FOR FORMING SUPERLATTICE STRUCTURE

Filed Dec. 8, 1970

INVENTOR

A. EUGENE BLAKESLEE

BY Sughrue, Rothwell, Mion, Zinn & Macpeak

ATTORNEYS

United States Patent Office 3,721,583
Patented Mar. 20, 1973

3,721,583

VAPOR PHASE EPITAXIAL DEPOSITION PROCESS FOR FORMING SUPERLATTICE STRUCTURE

A. Eugene Blakeslee, Mount Kisco, N.Y., assignor to International Business Machines Corporation, Armonk, N.Y.

Filed Dec. 8, 1970, Ser. No. 96,206
Int. Cl. B44d *1/18*
U.S. Cl. 117—215 18 Claims

ABSTRACT OF THE DISCLOSURE

A vapor phase epitaxial process for forming a superlattice structure comprising alternate layers of different semiconductor materials on a substrate. In the superlattice, the proportion of one component is caused to periodically vary from a desired maximum to a desired minimum over an extremely small period. For an *n* component system, this is accomplished by forming a stream comprising $n-1$ components and injecting pulses of the *n*th component in a carrier gas separated by pulses of carrier gas into the $n-1$ component stream, to thereby provide at the substrate alternate, discrete bursts of gas comprising *n* components and $n-1$ components, respectively. By critically controlling diffusion of adjacent pulses and bursts, the proportion of the *n*th component in the superlattice structure can be varied from a maximum to a minimum within an extremely small period.

High temperature, vapor phase epitaxial deposition apparatus for depositing such a repetitive superlattice structure: basically a pulsing chamber to receive the $n-1$ component stream; pulsing means to periodically pulse the *n*th component into the $n-1$ component stream, whereby the bursts described above are formed; and deposition means containing a substrate to receive said bursts for the formation of said superlattice. All elements are correlated to permit diffusion to be critically controlled.

BACKGROUND OF THE INVENTION

Field of the invention

The present invention relates to vapor phase epitaxial superlattice deposition processes and to apparatus useful therefor.

DESCRIPTION OF THE PRIOR ART

U.S. Pat. 3,441,453, Conrad et al., discloses a method for making graded band gap semiconductor materials by varying the composition of a pseudobinary Group III–V compound over a narrow thickness of the material. $GaAs_{1-x}P_x$ can be produced by varying *x* to produce semiconductor materials having a desired energy band gap between 1.38 and 2.24 ev. The composition of the epitaxial deposit is varied during deposition by varying the temperature of the substrate. No disclosure whatsoever of a process or apparatus in accordance with the present invention is taught.

U.S. Pat. 3,224,913, Ruehrwein, discloses a method of altering component proportions in a vapor deposition process to form a graded energy gap semiconductor material. While this patent discloses that a desired gradation profile can be obtained by regulating the composition of the reactant gases, there is no teaching whatsoever in this patent of a process for obtaining different epitaxial superlattice materials, nor of the apparatus of the present invention.

An article by J. J. Tietjen and J. A. Amick, J. Electrochem. Soc. 113, 724 (1966), discloses that semiconductor materials can be produced by carefully metering volatile compounds of the components of desired semiconductor material into the deposition zone. This article does not teach an injection cycle as in the present invention, nor the apparatus of the present invention.

SUMMARY OF THE INVENTION

In simplest terms, the present invention provides both a process and apparatus for forming epitaxial superlattice structures where the band gap energy of the superlattice structure can be caused to vary from a maximum to a minimum value within a period as small as 100 A.

By maximum value is meant here the band gap energy of those parts of the superlattice having compositions such that they possess the highest band gap, and conversely the minimum value is the band gap energy of those parts having compositions corresponding to the lowest band gap. For example, in the system $GaAs_{1-x}P_x$, choosing two different values of *x* specifies two compositions, the one with the higher value of *x* having a greater band gap than the one with the lesser value of *x*. Choosing the two particular values of $x=0$ and $x=1$ gives rise, respectively, to the compositions of pure GaAs and pure GaP, with the corresponding band gaps being 1.43 ev. and 2.24 ev., respectively. Any two different values of *x* in the range $0 \leq x \leq 1$ may be chosen, so long as the corresponding maximum and minimum band gaps differ by at least 0.1 ev., with a preferred range of the differential being 0.1 ev. to 0.5 ev.

The process of the present invention comprises forming a superlattice based on a system of *n* chemical elements wherein the *n* components are present as gaseous elements or compounds and co-deposit in monocrystalline form upon a substrate. The value of *n* may in principal be any number greater than or equal to two but in practice is usually not greater than four. $n-1$ of the components are brought together, if *n* is three or greater, to form a mixture. The *n*th component in a carrier gas is pulsed into the $n-1$ component stream separated by pulses of carrier gas initially substantially free of the *n*th component to provide, at the substrate, alternate bursts of gas containing *n* components and $n-1$ components, respectively. Which one of the *n* components in any given system is chosen to be added last to the gaseous mixture, i.e., which is to be considered the *n*th component in preference to the other $n-1$ components, is determined on the basis of relatively high volatility and consequent ease of pulsing, maximum effect in producing a change in band gap, and least disruption in crystal continuity, i.e. strain, per unit change in composition. In the case of $GaAs_{1-x}P_x$, where there are three components, the one best satisfying the above criteria is P. In this manner, alternate layers are deposited upon the substrate wherein the proportion of the *n*th component varies from a maximum (corresponding to a pulse containing the *n*th component) to a minimum (corresponding to a pulse of the carrier gas substantially free of the *n*th component). It is necessary to prevent substantial diffusion between pulses and bursts containing the *n*th component and pulses and bursts free of the *n*th component.

Apparatus to accomplish the above purpose basically comprises, in combination, what may be termed a pulsing chamber or zone, a deposition chamber or zone, and pulsing means. In the pulsing chamber, which receives the $n-1$ component stream, the *n*th component is periodically pulsed thereinto by the pulsing means. The pulsing chamber leads to a deposition zone wherein the substrate upon which deposition is desired is placed. Parameters of the apparatus are critical from the viewpoint that diffusion of adjacent pulses and bursts must be critically controlled. This is accomplished, e.g., by a critical control over pulse and burst residence time and interface contact area between adjacent pulses and adjacent bursts.

By minimizing diffusion, it is possible to abruptly change the composition of the *n*th component from a desired maximum to a desired minimum in a cyclic manner without substantial grading between the maximum and minimum values of the *n*th component, i.e., the energy band gap can be varied from a maximum to a minimum in a cyclic manner without substantial grading of the energy band gap between the maximum and minimum energy band gap values.

For certain superlattice structures, superior deposition is obtained upon a (3,1,1) substrate.

It is thus one object of the present invention to provide a process for producing an *n*-component epitaxial superlattice material where the proportion of the *n*th component can be cyclically and repetitively varied from a maximum to a minimum value.

It is a further object of the present invention to provide a process for producing epitaxial superlattice materials wherein the energy band gap can be varied from a desired maximum to a desired minimum with an extremely small period in a sharply discontinuous manner, that is, without substantial energy band gap grading between maximum and minimum energy band gap values.

It is a further object of the present invention to provide a superlattice structure having alternate layers of maximum and minimum energy band gap wherein the grading between the alternate layers occurs over a thickness of the superlattice structure as much as 2 orders of magnitude thinner than heretofore achievable.

It is yet another object of the present invention to provide apparatus for accomplishing each and every of the above objects.

These and other objects of the present invention are explained in greater detail on the following material.

DETAILED DESCRIPTION OF THE PREFERRED EMBODIMENTS

Figure 1:
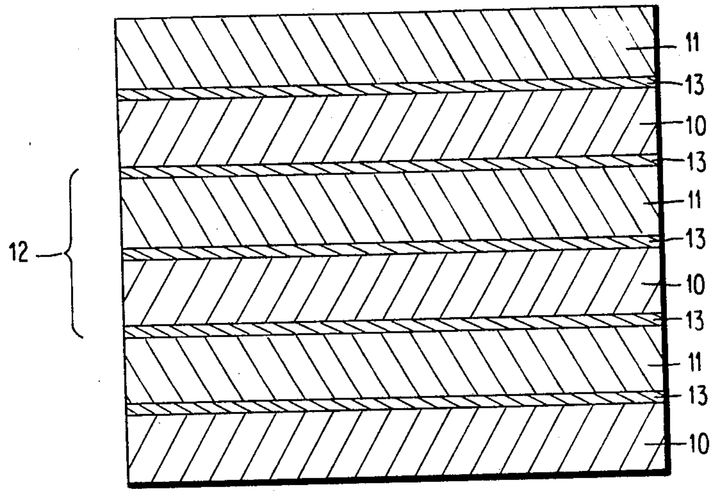
FIG. 1 is a cross-sectional view of a portion of a superlattice structure formed in accordance with the present invention.

Before entering into a discussion of the exact improvement of this invention, it is appropriate to indicate the types of epitaxial superlattice films and the broad processing conditions which can be used in accordance with the present invention.

The present invention basically relates to the production of binary, ternary, or quaternary epitaxial superlattice films from compounds or elements selected, respectively, from Group IV–A of the Periodic Table, from combinations of Groups III–A and V–A materials, and/or from combinations of Groups II–B and VI–A materials. In the III–A—V–A combination or in the II–B—VI–A combination at least one element from each of the two groups must be present. The most preferred elements from these groups for use in the present invention are silicon, germanium, carbon, lead and tin from Group IV–A; boron, aluminum, gallium and indium from Group III–A; phosphorus, arsenic, antimony and bismuth from Group V–A; zinc, cadmium and mercury from Group II–B; and sulfur, selenium and tellurium from Group VI–A.

Representative of the semiconductor systems which can be grown as epitaxial films and fashioned into superlattices in accordance with the present invention are those having the formulas: $Ge_xSi_{1-x}$, $Si_xC_{1-x}$, $B_xAl_{1-x}P$, $Al_xGa_{1-x}P$, $GaP_xAs_{1-x}$, $In_xGa_{1-x}As$, $InSb_xAs_{1-x}$, $Ga_xAl_{1-x}As$, $In_xGa_{1-x}Sb$, $In_xGa_{1-x}Sb_yAs_{1-y}$, $$GaP_x(As_ySb_{1-y})_{1-x}$$

$Zn_xCd_{1-x}S$, $CdS_xSe_{1-x}$, $Hg_xCd_{1-x}Te$, $CdSe_xTe_{1-x}$ and $Zn_xHg_{1-x}S_yTe_{1-y}$.

In all these systems *x* and *y* have numerical values between zero and one. Furthermore, in the superlattice structures, *x* and *y* each have different values in the successive adjacent layers; that is, *x* and *y* take on maximum (or minimum) values in one layer, and in the next adjacent layer they take on the corresponding minimum (or maximum) values. In intervening graded regions, if such are present, *x* and *y* will have a range of values between the maxima and minima thereof.

The epitaxial superlattice films of the present invention are prepared by the reaction of gaseous compounds at a heated substrate in the presence of an excess of hydrogen or other carrier gas. The element whose composition is variable, as indicated by the subscript *x* or *y*, is introduced last, in a periodic fashion, as controlled by pulsing apparatus in accordance with the present invention. The other component(s) are introduced and mixed, if necessary, prior to deposition. Thus, for the alloy $Ge_xSi_{1-x}$, a gaseous form of Ge would be introduced into a pulsing chamber prior to the deposition chamber, and a gaseous form of Si would then be introduced into the Ge through pulsing means. For $GaAs_{1-x}P_x$, gasous species containing Ga and As would be introduced and mixed prior to the pulsing chamber and a gaseous form of P would then be introduced to the Ga-As mixture through pulsing means.

Members of Groups II–B and VI–A (e.g. Hg, Cd and Te) are sufficiently volatile that they may, under some conditions, be introduced as pure gaseous elements. Elements from the other groups, and sometimes those from Groups II–B and VI–A as well, would normally be introduced as gaseous compounds. The general classes of compounds known as halides (e.g. gallium monochloride and indium monochloride), hydrides (e.g. arsine and phosphine), and alkyl derivatives (e.g. gallium trimethyl and aluminum trimethyl), including certain combinations thereof such as halohydrides or haloalkyl derivatives, are most useful for this purpose. However, the present invention is not to be limited thereto, as other operable classes of compounds will be obvious to one skilled in the art.

It will be apparent, from the above listing, that the various types of compounds or elements used for the vapor phase superlattice deposition of the present invention are, essentially, those compounds or elements used for vapor phase epitaxial depositions in the prior art.

Generally speaking, the mole fraction of the gaseous reactants used in the present invention should be from 0.002 to about 0.02 mole percent, based on the total gaseous composition.

The gaseous reactants are always used in the presence of a large amount of hydrogen or equivalent carrier gas. Preferably, the mole fraction of molecular hydrogen is .95 or greater, based on the total gaseous composition. Most preferably, the mole fraction of hydrogen is .98 or greater. Oxidizing gases must, of course, be excluded from the system of this invention.

The temperature used in carrying out the depositions of the present invention is, essentially, in accordance with the art-recognized temperatures utilized for vapor phase epitaxial depositions, whether they be by a disproportionation mechanism or a thermal decomposition process. For instance, the temperature of operation for deposition involving the described III–A compounds and the described V–A compounds will generally be within the range of 400° C. to 1500° C., with a preferred operational range being 600° C. to 1300° C. It will be appreciated by one skilled in the art that the temperature, or operable range, of operation for any selected system is specific to the individual materials being combined or deposited, as is known to the art.

The pressure of operation in the vapor phase superlattice deposition process of the present invention is, basically, usually about one atmosphere. This is because the present process is always operated as an open tube continuous flow system and pressure, unless artifically increased or decreased, is most easily maintained at about one atmosphere. Generally speaking, a preferred range of operation is from about .01 to about 2 atmospheres. However, in view of the complexity involved with such sub or super atmospheric pressures, such will rarely be utilized.

For representative deposition conditions and materials useful in the present invention, reference should be made to U.S. Pats. 3,224,913; 3,441,453 and 3,261,726, describing materials and general deposition conditions useful in the present invention. These three references are hereby incorporated by reference.

Having thus described the operational background parameters of the present invention, it is appropriate to turn to the exact improvement of the present invention.

As heretofore indicated, the essence of the present invention relates to the formation of a superlattice structure. As disclosed in the IBM Journal of Research and Development, vol. 14, No. 1, January 1970, in the article entitled "Superlattice and Negative Differential Conductivity in Semiconductors," by R. Tsu and L. Esaki, the term "superlattice" defines, as is known to the art, a man-made semiconductor into which is built a periodic variation of potential, that is, a monocrystalline semiconductor where the potential varies a few tenths of an electron volt in a periodic fashion such that the period of the variation is less than the mean free path of the electrons. The most striking electrical effect of such a superlattice is a negative resistance at relatively low electric fields. The theoretical basis for this effect is that in a superlattice device the additional periodicity of the superimposed potential fluctuation subdivides the first Brillouin zone into what may be termed mini-zones, with boundaries inversely proportional to the superlattice spacing. The mini-zone boundaries occur at much lower momentum values and the associated forbidden energy gaps occur at lower energies. Just as in the normal Brillouin zone, there is an inflection point in E vs. $k$ in the mini-zone, and an eletron should decelerate upon increasing the applied potential past this point, resulting in a negative differential conductance. Such a superlattice structure is obtained by a periodic variation of alloy composition or impurity density during epitaxial growth utilizing a period shorter than the electron mean free path. Such a structure exhibits properties different from those of the host crystal.

An epitaxial superlattice structure as described above can provide significant advantages as a high speed amplifier or oscillator. In such materials, it is often required that the band gap in the superlattice structure oscillate from a maximum to a minimum with a period as small as 100 A. To sharply and rapidly vary the band gap over a period as small as 100 A. requires the ability to produce a rapid and discontinuous band gap change over a spacing which can be as small as 20 atom layers. To be of any practical use such a structure must be reproducible for 100 or more of such oscillations, that is, treating two of such layers as a single pair, it must be possible to accurately reproduce 50 of such pairs.

To appreciate the requirements of a superlattice structure, it is appropriate to refer to FIG. 1 of the drawings. In FIG. 1 there is shown a simplified cross section of a superlattice structure formed in accordance with the present invention, in this instance, based uopn the ternary semiconductor $GaAs_{1-x}P_x$. A superlattice structure as formed in accordance with the present invention can, for simplified purposes, be viewed as a series of alternating "layers" wherein the proportion of the $n$th component (which is P in the present instance) varies from a maximum to a minimum value in alternating "layers." In FIG. 1, "maximum" layers of P concentration are represented by the numeral 10 and "minimum" layers of P concentration are represented by numeral 11. The distance 12 represents one period of the superlattice structure, i.e., one complete cycle of maximum/minimum/maximum P concentration. Separating each layer 10 of maximum concentration and each layer 11 of minimum concentration is what is termed an energy band gap grading 13. The energy band gap grading 13 represents what can be considered a region of transition from a maximum P concentration layer 10 to a minimum P concentration layer 11.

For many superlattice structures it is desirable that grading 13 be as abrupt as possible, i.e., the transition zone between bordering "layers" of maximum and minimum P concentration occur over an extremely low number of atom layers. In other instances, the grading 13 can represent a significant fraction of a total period 12, i.e., there is a significant region between maximum and minimum P values where the concentration of P is changing from the maximum to minimum, or vice-versa.

However, in any superlattice produced by this invention the total period, as compared to any prior art repetitive semiconductor structure, is approximately two orders of magnitude thinner than heretofore obtainable. In simplest terms, the present invention enables one to form a repetitive semiconductor structure with a period heretofore existent only in the realm of theory. Further, since it is possible to abruptly vary the concentration of the $n$th component, it is thereby possible to vary the energy band gap in the superlattice structure to obtain alternating "layers" of superlattice material whose energy band gaps differ by only a few tenths of an electron volt without substantial "grading" of the energy band gap between layers. Overlooking the thinness of the repetitive superlattice which can be formed in accordance with the present invention, the prior art has never contemplated an essentially simple, unified process for forming such a discontinuous structure.

With specific reference to the compound $GaAs_{1-x}P_x$, it can be seen that alternate layers of this material actually comprise two different semiconductor materials in that the value of $x$ in the alternate layers varies from a desired maximum value to a desired minimum value. In accordance with the present invention, one can prepare a superlattice structure on a substrate comprising alternating layers of epitaxial $GaAs_{1-x}P_x$ with a period as small as 100 A. where the value of $x$ sharply and abruptly changes in alternate "layers" from about .16 to about .42 and the energy band gap can vary from about 1.57 to about 1.83 electron volts.

Having thus generally described one representative superlattice structure which can be formed in accordance with the present invention, it is appropriate to turn to a discussion of representative process and apparatus which can be utilized in accordance with the present invention. The following discussion will, in many instances, deal with a specific superlattice composition of $GaAs_{1-x}P_x$. Such a material can be formed from the reactants GaCl, $AsH_3$ and $PH_3$. This is an $n$ component system where $n$ is 3. The $n$th component in this example is phosphorus, and the $n-1$ component stream comprises GaCl and $AsH_3$, in providing this preferred superlattice.

In the following discussion, the term "pulse" will be used to refer to the alternate volumes of carrier gas which are injected into the $n-1$ component stream, one set of which contains the $n$th component and the other alternating set of which is free of the $n$th component. For purposes of clarity, the term "burst" will be used to refer to the corresponding alternate volumes of the $n-1$ component stream immediately subsequent to pulsing. Where a pulse contains the $n$th component (an "on cycle" pulse) the volume of the $n-1$ stream into which this pulse is injected will then be an $n$ component containing burst. Where a pulse is free of the $n$th component (an "off cycle" pulse) the volume of the $n-1$ component stream into which this pulse is injected will be an $n-1$ component burst. It shall be understood, however, that this is only for purposes of explanation, and in actuality the term burst is only used to provide a convenient term to differentiate what is essentially a larger pulse.

From a process aspect, the present invention is based upon the concept of pulsing the *n*th component of the superlattice structure into the $n-1$ component stream under certain critical conditions. With specific reference to the material $GaAs_{1-x}P_x$ the present invention enables such an epitaxial superlattice structure to be formed by rapidly and periodically varying the concentration of phosphorus at the substrate upon which deposition is to occur by pulsing $PH_3$ into a GaCl-$AsH_3$ stream (all in a carrier gas). Since a discussion of the apparatus of the present invention enables a comprehension of the significant process parameters to be more easily attained, the following discussion deals with apparatus in accordance with the present invention as shown in FIG. 2 of the drawings.

Figure 2:
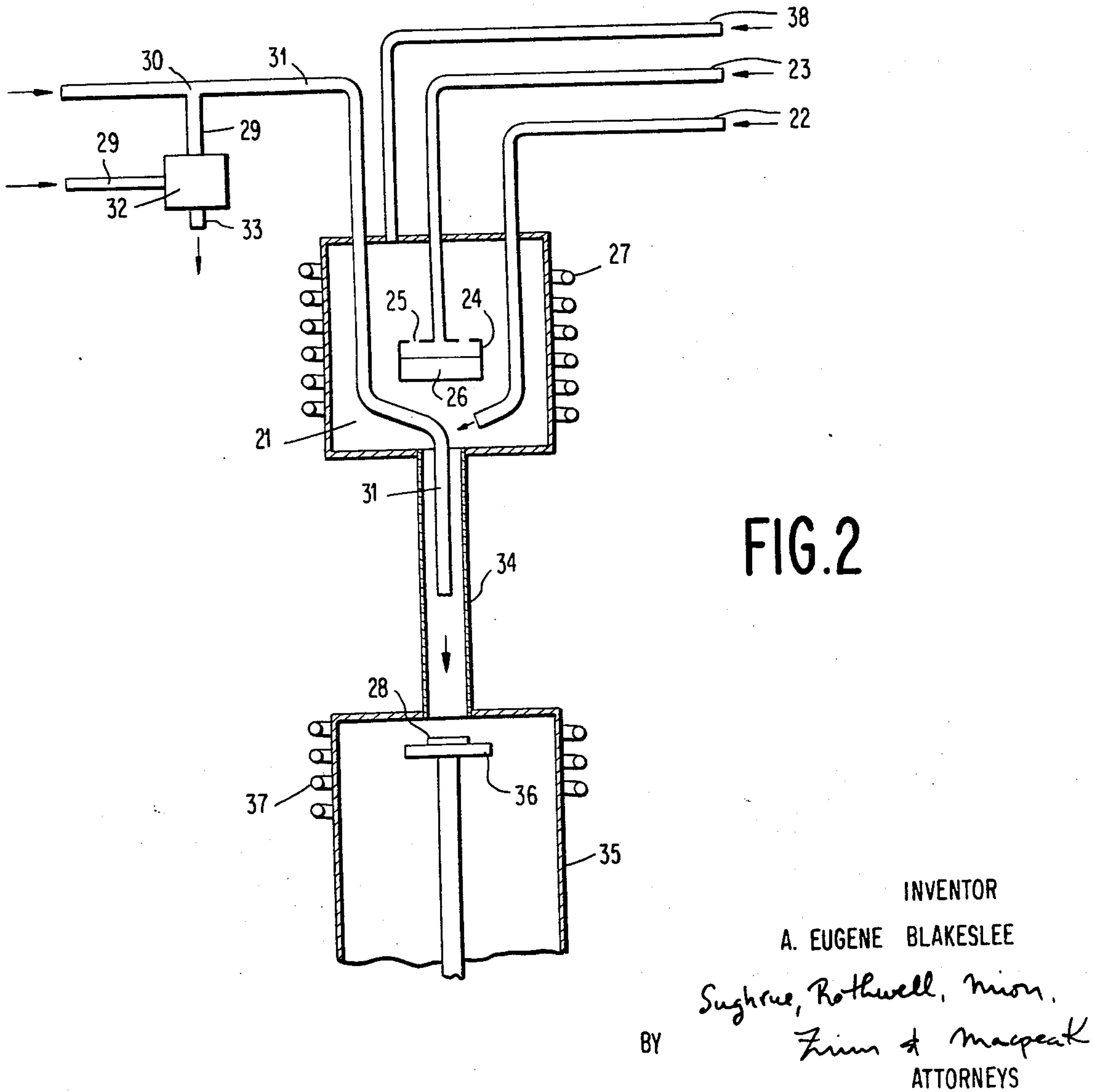
FIG. 2 is a schematic cross-section view of apparatus useful in the present invention.

With reference to FIG. 2 of the drawings, there is shown representative apparatus for forming a ternary superlattice, i.e., a $GaAs_{1-x}P_x$ superlattice, from GaCl, $AsH_3$ and $PH_3$, all in a carrier gas, e.g., hydrogen. The main components are an $n-1$ component, e.g., $$GaCl+AsH_3$$

mixing chamber 21, a pulsing chamber 34 (which receives the $n-1$ component stream from the mixing chamber) wherein the *n*th component, i.e., $PH_3$, is injected into the $n-1$ component stream by the pulsing means via an injection tube 31 and a deposition chamber 35 wherein the superlattice is deposited.

In greater detail there is shown a first chamber 21. This chamber is the mixing chamber which basically insures that the $PH_3$ is pulsed into a homogenous mixture of GaCl and $AsH_3$. If one uses a "pre-mixed" $n-1$ component gas stream, a mixing chamber would not be required and the "pre-mixed" $n-1$ component stream could be introduced directly into the chamber where pulsing occurs. For a binary, i.e., $n=2$, component stream, obviously a mixing chamber is not required. The mixing chamber is thus optional, though highly preferred to avoid a possible increase in turbulent flow which might result from direct introduction of the $n-1$ component stream into the chamber where pulsing occurs.

$AsH_3$ in hydrogen is introduced into the mixing chamber 21 via line 22. Although GaCl can be directly introduced into the system, in the present embodiment GaCl is actually formed in the mixing chamber 21. This is accomplished by introducing a stream of hydrogen chloride in the carrier gas via line 23 into a gallium reservoir 24 in the interior of mixing chamber 21. Vents 25 are provided in the top of the gallium reservoir 24 so that the hydrogen chloride in the carrier gas entering via line 23 is contacted with the gallium 26 in the gallium reservoir 24, reacted, and passed into the mixing chamber 21 via vents 25 where the GaCl formed in the interior of the gallium reservoir 24 is mixed with the $AsH_3$. Appropriate heating coils 27 are provided around the exterior of the mixing chamber 21 to provide the temperature required for the HCl-Ga reaction.

At this point, one has formed the homogenous $n-1$ component stream in its carrier gas which is, of course, maintained at a temperature which prohibits deposition. From this point of the process, certain very critical qualitative and quantitative apparatus/process conditions must be observed to obtain a superlattice structure. Firstly, one following the prior art teachings would by now have formed the complete *n*-component stream, and would have immediately sought to initiate deposition. Contrary to general prior art deposition processes, to achieve the type of periodic structure heretofore described it is necessary to maintain the $n-1$ component stream, i.e., the GaCl and $AsH_3$, separate from the *n*th component, i.e., the $PH_3$, until a point just prior to the substrate upon which deposition is desired.

In the present embodiment, this is done by injecting pulses of $PH_3$ in a carrier gas under certain very critical conditions into the GaCl-$AsH_3$ mixture at a point subsequent to the first mixing chamber 21 but prior to the substrate 28 to form alternate bursts of GaCl-$AsH_3$ separated by bursts of GaCl-$AsH_3PH_3$. The critical feature here is to control interdiffusion of adjacent pulses and bursts, as will later be explained. In the apparatus of this embodiment, for a ternary material, the $PH_3$ is injected into the GaCl-$AsH_3$ mixture via $PH_3$ injection tube 31, i.e., $PH_3$ from line 29 is rapidly injected, on a periodic basis, into flowing carrier gas in line 30 whereafter the composite stream is fed into the $PH_3$ injection tube 31. Pulsing of the $PH_3$ is accomplished by alternately feeding $PH_3$ from line 29 into the carrier gas in line 30 through a pulsing valve 32 and venting $PH_3$ via vent line 33. In this embodiment, the total pulsing means comprises members 29 to 33, i.e., all elements required to form the pulses and inject the same into the $n-1$ component stream.

By pulsing $PH_3$ from line 29 into the carrier gas in line 30, it is possible to obtain discrete pulses of carrier gas containing $PH_3$ from the injection tube 31 separated by discrete pulses, or clouds, of substantially pure carrier gas which does not contain $PH_3$. The carrier gas stream 30 is always much greater in volume than the $PH_3$. This is to avoid substantial fluctuation in the total volume of gas per unit time exiting injection tube 31. If the $PH_3$ were to comprise a large proportion of the gas exiting injection tube 31, obviously turbulence would be increased since a pulse containing $PH_3$ would significantly increase velocity at the instant of its injection as compared to a $PH_3$-free pulse, and cause an abrupt velocity decrease at pulse termination. It is to be understood this is actually a qualitative parameter based upon a desire to keep adjacent pulses from interdiffusing to an undesirable degree. Preferably, the $PH_3$ pulse will comprise no more than 10% by volume of the carrier gas in line 30, and most preferably 1 to 5% by volume.

Thus, the gas stream which leaves the pulsing chamber 34 and enters the deposition chamber 35 will, due to the periodic pulses of $PH_3$ injected therein, comprise separate bursts of gas containing, alternately, a high $PH_3$ concentration and a low $PH_3$ concentration. Thereafter, the gaseous mixture passes into the deposition chamber 35 where epitaxial deposition of alternate layers of different semiconductor material occurs upon the substrate 28 shown carried on a substrate carrier 36. Appropriate heating coils 37 are provided at the exterior of the deposition chamber 35 to maintain a suitable temperature therein.

To provide the required amount of carrier gas needed for the described system, carrier gas injection line 38 is shown for introducing carrier gas into chamber 21.

Having thus described apparatus which can be used to accomplish the objects of the present invention, it is appropriate to correlate the same with the process of the present invention.

To obtain the epitaxial superlattice structure of the present invention, it is necessary that alternating pulses of carrier gas containing the *n*th component and carrier gas free of the *n*th component, and the alternating bursts derived therefrom, do not interdiffuse to any significant extent during the process of the present invention. The reason for this is that the final, solid superlattice structure will vary with the composition of the gas stream from which it is derived. In other words, the abruptness of a change from layer to layer will depend upon the amount of interdiffusion which occurs. If diffusion is extensive, the bursts of $PH_3$-containing gas will tend to equalize their composition with bursts of gas free of $PH_3$, reaching at the extreme of complete interdiffusion, a homogeneous epitaxial structure, that is, a structure wherein $x$ is constant. In simple terminology the degree of interdiffusion of any one pulse or bursts into the immediately preceding and following pulse or bursts must be controlled or a superlattice cannot be obtained.

Expanding upon the above, initially any single $PH_3$-containing pulse will always be bounded by two pulses initially free of $PH_3$, i.e., substantially, pure carrier gas. From the instant of formation, diffusion of $PH_3$ into the surrounding pulses of carrier gas (and the converse) will occur. Viewing each pulse as a separate unit or slug, diffusion will occur at the interface of different slugs. In other words, what will occur is that the pulse containing $PH_3$ will, at its interface with the carrier gas pulses, begin to lose its distinct character as a $PH_3$ pulse. This tendency towards equalization of the compositions of adjacent pulses continues after pulsing, or burst formation. Of course, after pulsing the diffusion will be of an $n$ component burst into an $n-1$ component burst.

Since $n$th component diffusion begins at the moment of pulse formation and continues to deposition, the extreme of zero diffusion is impossible to obtain. At the other extreme is complete diffusion, providing a homogenous film where $x$ is an average of $x_{minimum}$ and $x_{maximum}$. Intermediate between these two extremes is the area of controlled diffusion, e.g., if diffusion proceeds for only a short time, i.e., deposition rapidly follows pulsing, the "interface mingling" will be minor and the main body of all bursts will still have a composition substantially identical to that at their formation. For instance, the $n$th component pulsing sequence, off, on, off, would yield, upon deposition, the following sequential structure: a relatively "thick" minimum $x$ "layer," a very thin "grading" (due to the "interface mingling"), a relatively "thick" maximum $x$ "layer," a very thin "grading," and a relatively "thick" minimum $x$ layer. Obviously, if "interface mingling" proceeds to a great degree, i.e., the pulses or bursts have substantially diffused, upon deposition one obtains: a relatively "thin" minimum x "layer," a relatively "thick grading" and a "thin" maximum $x$ layer, etc., where the band gap of the two layers changes over a relatively great thickness.

The degree of diffusion permissible in obtaining any superlattice will, of course, depend upon the desired degree of grading between layers.

To maintain the required degree of interdiffusion within the bounds necessary for superlattice formation, the two most important criteria which must be critically controlled are the system residence time and the interface contact area for the pulses and the bursts. The term "interface contact area" defines the area of contact between two alternate pulses or bursts. Viewing any single pulse or burst as an idealized cylinder, the "interface contact area" is the area where the two ends of the cylinder meet.

These two factors are important because interdiffusion is time dependent. If residence time is minimized, alternate pulses or bursts are in contact with each other for shorter periods of time, and interdiffusion will be lessened. Since interdiffusion is time dependent, the main purpose of controlling the interface contact area is to "elongate" adjacent pulses or bursts once they are formed. The following hypothetical explanation illustrates the consequences of this elongation, with the values given being for illustration purposes only.

For a given time, no matter what the total length of a pulse or burst is, diffusion will occur a distance .2× into that pulse or burst. To pass a given pulse volume per unit time one can use a small conduit with a total pulse length of 5×, or a proportionately large conduit with a pulse length of e.g., .5×. In the former case, a diffusion length of .2× will be minor, and permit a relatively discontinuous superlattice to be formed, whereas in the latter instance the same diffusion length will begin to yield a homogeneous mixture.

It is thus important, to obtain maximum discontinuity between alternate layers of the superlattice, to minimize residence time and to maximize burst length, thereby achieving interdiffusion over the lowest possible total length of a pulse. It will again be apparent that as the discontinuity desired in the superlattice varies, so can both the residence time and interface area.

The above criteria are met, in part, by:

(1) maintaining a high proportion of carrier gas with respect to all active deposition components;

(2) using the smallest feasible conduit between pulse formation and injection of the pulse into the $n-1$ component stream;

(3) pulsing the $n$th component into the $n-1$ component stream at a point of minimum area in the system i.e., to insure maximum flow velocity; and (4) locating the substrate as close as is feasible to both the point of pulse and to the termination of the chamber or zone in which pulsing of the $n$th component occurs.

Turning now to the above factors in greater detail, the amount of carrier gas with respect to all reactants is preferably at least 40 to 80 times the volume of all other reactants. It will be appreciated that carrier gases are often used in prior art deposition processes. However, the only reason for using a carrier gas in the prior art is to permit a sufficiently diluted reaction mixture to be formed. While this is one reason for the use of a carrier gas in this invention, the carrier gas also serves the function of decreasing residence time of the $n$-component stream between formation and deposition. However, the amount of carrier gas can vary greatly, depending upon the degree of interdiffusion permissible. The concept of decreasing residence time by using a large amount of carrier gas is thus largely qualitative in nature rather than quantitive, i.e., an amount of carrier gas is used which permits the desired superlattice to be obtained, with primary emphasis being upon limiting the extent of diffusion rather than any critical ratio of carrier gas per se.

In view of the heretofore offered discussion, it will be apparent that minimizing the flow area for the pulses will minimize residence time and the interface contact area, thereby reducing the effect of diffusion (second factor).

With respect to the third factor enumerated above, since interdiffusion is time dependent, pulsing preferably occurs into an area of maximum flow velocity in the system to achieve minimum burst residence time. This is achieved in the present invention, perhaps most simply, by insuring that the pulsing chamber has the minimum flow area of the system (other than the pulsing means per se) whereby the interface contact area is also minimized.

It should be understood, however, that there would be no objection if the pulsing chamber were not the area of maximum flow velocity in the system, so long as the residence time and interface contact area were correlated to appropriately limit the interdiffusion. However, practically speaking, such a construction would lead to a highly complicated system wherein one would have, e.g., an extremely small mixing chamber, a large pulsing chamber, and an extremely small deposition chamber. Since the number of process lines in the pulsing chamber is generally only one, it can be seen that the pulsing chamber is most easily set as the area of maximum flow velocity (minimum residence time and minimum interface contact area) of the system.

The above three factors can, in actuality, be balanced against each other as heretofore indicated. For instance, by increasing the amounts of carrier gas, residence time in the system would be decreased for constant flow area and constant pulsing chamber length. For constant flow, one could decrease the cross-sectional area of the pulsing chamber and thereby achieve both a lower residence time and a lower interface area. Obviously, by varying the length of the pulsing chamber one can effect the total residence time, while permitting gas flow, velocity and interface area to remain constant. Generally speaking, for minimum residence time the shortest feasible pulsing chamber is used.

It is believed that the above discussion will make it clear that once the necessary degree of interdiffusion is selected, each of the above factors can be varied to obtain different superlattice structures.

In actuality, a separate pulsing chamber per se is of impact primarily where a three or greater component stream is being deposited. This is due to the fact that when three or more components are being deposited, the $n-1$ component stream has to be initially mixed, and such is most easily accomplished in a first mixing chamber which is relatively wide as compared to the pulsing chamber, since the first mixing chamber must handle a number of process lines. For a binary system, of course, the $n-1$ component stream is only one component and can be introduced directly into one end of the pulsing chamber to have the $n$th component pulsed thereinto. Thus, the pulsing chamber in a binary system is used in combination with a deposition chamber, and since the deposition chamber must contain the substrate, substrate support, etc., the pulsing chamber will, in a binary system, for practical reasons, be the area of maximum flow velocity in the system.

By placing the substrate as close as possible to the pulsing chamber 34, interdiffusion of the $PH_3$ is minimized. The reason that interdiffusion will occur upon exiting the pulsing chamber is that the deposition chamber will almost always, for practical reasons (it contains the substrate, support etc.) be of greater diameter than the pulsing chamber. The bursts of gas thus experience a sharp velocity drop and a particular tendency towards diffusion at the edges of the cloud of $n$-component gas. This diffusion is increased at greater travel distances after exit from the pulsing chamber. For practical superlattice fabrication, the distance between the effective edge of the pulsing chamber and the substrate is 0.5 to 2.0 cm.

For very small structures, however, the substrate can be placed in the end of the pulsing chamber, which would then comprise a pulsing zone and deposition zone, i.e., the pulsing zone would terminate at the substrate. In this instance, the substrate is placed as close as is feasible to the point of pulsing compatible with the requirements that: (1) alternating bursts do not interdiffuse with each other to an unacceptable degree; (2) a pulse nonetheless does form a homogeneous mixture with the portion of the $n-1$ component stream into which it is pulsed.

Considering all of the above factors, to form a superlattice with a period of from about 100 A. to about 500 A., operation within the following parameters has been found to provide most preferred results:

| | |
|---|---|
| Volume percent which all reactants comprise of the carrier gas (based on the carrier gas at 1 atm.), percent | 0.5 to 2 |
| Volume percent which the $n$th component comprises of a pulse at formation (based on the volume of carrier gas at 1 atm.), percent | 1 to 10 |
| Volume percent which any pulse comprises of the $n-1$ component stream (based on the volume of the $n-1$ component stream at 1 atm. which receives that pulse), percent | 10 to 30 |
| Total flow of gas (in $cm.^3$/min. at 1 atm.) | 1,000 to 3,000 |
| Average cross-sectional area of pulsing chamber between the point of pulsing and deposition or the exit point of the bursts from the chamber (in $cm.^2$) | 0.5 to 1.0 |
| Length of pulsing chamber between the point of pulsing and deposition or the exit point of the bursts from the chamber (in cm.) | 10 to 20 |
| Average pulse residence time and interface contact area (formation to pulsing) | (1) |
| Average burst residence time and interface contact area in pulsing chamber | (2) |
| Distance from the termination of the pulsing chamber to the substrate surface when substrate is not inside pulsing chamber (in cm.) | 0 to 2 |
| Average gas velocity in the pulsing chamber between the point of pulsing and deposition or the exit point of the bursts from the chamber (in cm./sec.) | 100 to 300 |
| Ratio of the flow area of the pulsing chamber (in $cm.^2$) to the flow area of the deposition chamber when a separate deposition chamber is used (in $cm.^2$) | 0.3 to 1.0 |
| Length of tube between injection of $n$th component into carrier gas and point of pulsing into $n-1$ component stream (in cm.) | 20 to 50 |
| Average inner diameter of tube between injection of $n$th component into carrier gas and point of pulsing into $n-1$ component stream (in mm.) | 1 to 5 |

[1] .05 to .3 sec., 2 to 10 $mm.^2$

[2] .05 to 3 sec., .5 to 1.0 $cm.^2$.

By following the teachings above, one skilled in the art can, by appropriate adjustment depending upon the area of the superlattice formed, achieve the residence time and interface contact area required in the present invention to maintain the degree of interdiffusion within permissible bounds.

To achieve the extremely thin, discontinuous structure heretofore described, a very low growth rate is required with a very high frequency of $n$th component injection. To achieve a structure as described, it is necessary that the growth rate of the superlattice be maintained within the range 2 microns/hour to 40 microns/hour. Most preferably, the growth rate is 5 microns per hour (14 angstroms per second). When the growth rate has this preferred value, 100 A. layers can be grown by injecting the $n$th component every 7 seconds into the system. For the general range heretofore set forth, an "on cycle" ($n$th component injection) would occur every 0.9 to every 90 seconds with the duration of an "on" pulse preferably varying from ¼ to ¾ of the total cycle time (1 period). The preferred range is 1 to 10 seconds. To obtain a repetitive structure, it is mandatory that the $n$th component injection cycle be maintained constant although it will be clear that the duration of the $n$th component containing pulse need not be equal to the duration of a carrier gas pulse.

The following data tabulates the pulsing rate (the time between each injection of the $n$th component into the carrier gas) required to produce 100 A. and 500 A. layers, respectively, for each of three different growth rates.

| Growth rate of— | | Pulsing rate for— | |
|---|---|---|---|
| μ/hr. | =A./sec. | 100 A. layers | 500 A. layers |
| 2 | 5.6 | Every 18 sec. | Every 90 sec. |
| 5 | 14 | Every 7 sec. | Every 35 sec. |
| 40 | 112 | Every .9 sec. | Every 4.5 sec. |

In view of the above discussion, the following specific example is offered.

EXAMPLE 1

The apparatus heretofore described in the drawings was used in this example to obtain a GaAs $_{1-x}P_x$ structure having a period of 300 angstroms (about 60 atom layers).

Deposition occurred upon a [1,0,0] GaAs substrate doped n-type to about $10^{18}$ carriers/cc.

The final structure formed was actually a superlattice "sandwich." Specifically, on the GaAs substrate there was grown a 10μ n± GaAs expitaxial layer, a 1μ superlattice was then deposited, and finally a 10μ n+ GaAs expitaxial layer was deposited. The GaAs layers can simply be grown by withholding $PH_3$ injection, i.e., in the absence of $PH_3$ pulsing, by maintaining all other process parameters the same. Of course, the process growth without pulsing is not part of the present invention.

Flow lines 22, 23 and 30 had an inner diameter of 2 mm. Line 38 had a 4 mm. inner diameter. The mixing chamber 21 had an ID of 45 mm. and the pulsing chamber 34 had a 10 mm. ID. Injection tube 31 was placed 12 mm. into the 165 mm. long pulsing chamber. The end of the pulsing chamber was within ½" of the substrate 28. The deposition chamber, or substrate zone, had an ID of 45 mm. The injection tube 31 length was 43 cm. (2 mm. ID).

A flow rate of 200 cc./min. of hydrogen in the injection tube 31 was utilized. An injection cycle of 6 seconds was used, i.e., $PH_3$ from line 29 was pulsed via line 12 into the hydrogen in line 30 for 2 seconds and vented via line 33 for 4 seconds. The $PH_3$ was pulsed into the stream at a rate of 4 cc./min. during the on cycle. A solenoid valve available from Skinner Precision Industries, Inc. (Model V54DB2100) was used to control pulsing.

6 cc./min. $AsH_3$ in 200 cc./min. hydrogen and 55 cc./min. HCl in 200 cc./min. $H_2$ were utilized, the HCl reacting with gallium in the reservoir to produce 5 cc./min. of GaCl. For depositing $GaAs_{1-x}P_x$ at 750° C. the minimum $HCl/H_2$ flow should be 10 cc./min. Hydrogen was introduced via line 38 to yield a total flow in the described apparatus of 1,000 cc./min.

The total pressure in the system was 1 atmosphere. The temperatures in the first mixing chamber was 900° C. and the temperature at the substrate was 750° C.

By following the above parameters $GaAs_{1-x}P_x$ was deposited at a rate of 56 angstroms per second leading to a superlattice period of approximately 300 angstroms. The grading between adjacent layers was estimated to be 20 atom layers, $x$ to vary from .16 to .42 in alternate layers and the corresponding band gap to change from 1.57 to 1.83 ev.

It will be apparent to one skilled in the art that the dimensions in the system are not overly critical for the mixing chamber 21 since no $PH_3$ will be present therein.

While the above discussion has been made with reference to the formation of $GaAs_{1-x}P_x$, the principles set forth can be utilized to deposit binary, other ternary or quaternary epitaxial superlattice films as described in this specification. Needless to say, temperature and pressure can vary in the system within the heretofore parameters. However, one cannot violate the principles set forth in the specification for obtaining the periodic structure of this invention.

EXAMPLE 2

Upon examining the product formed in accordance with Example 1 with an electron microscope, some deviations from a completely planar surface were observed. However, in Example 1 a wafer with a (1,0,0) orientation was used which had a curved edge. It was noted upon close examination that the epitaxial layers deposited around this curved edge contained a section with a much flatter superlattice structure than the remainder of the wafer. The orientation of this curved section was found to be very close to the (3,1,1) plane.

Accordingly, a wafer exactly as used in Example 1 except with (3,1,1) orientation was substituted for the wafer of Example 1, and the process run repeated.

The superlattice structure and the resultant layers turned out to be much flatter than those obtained in utilizing a (1,0,0) substrate, and it was found to be possible to produce successive layers of extreme planarity.

Accordingly, an improved aspect of the present invention comprise a superlattice structure as defined formed on a (3,1,1) oriented wafer. This has unexpectedly been found to provide successive layers parallel to each other and to the substrate. Such is very important in thin layers which can be formed in accordance with the present invention since a small kink in a layer, or other defect, which would have a negligible effect on a thick layer can produce serious local electrical discontinuities in a thin layer.

EXAMPLE 3

The exact process and apparatus of Example 1 was used but the amount of hydrogen added was increased to yield a total gas flow of 2,000 cc./min. and the ID of the deposition chamber or substrate zone was decreased to 15 mm. The gas velocity was increased in the pulsing chamber. In the deposition chamber gas velocity increased by a factor of 18. Comparable results to those of Example 1 were obtained.

Electron microscopic techniques are very useful to demonstrate when a superlattice has been successfully grown and to measure its period. However, they tell very little about the amplitude of the concentration variation. The most conclusive proof that the change in the phosphorus mol fraction within the superlattice is non-trivial has been obtained by an X-ray technique. The X-ray measurements were made by recording the intensity of (400) diffraction peaks from a superlattice which differed from that of Example 1 in that the top layer of GaAs was not grown. This topless form, which is more suitable also for certain electrical measurements, allows the X-rays to penetrate directly into the superlattice. When very thin layers of two different crystalline substances are interleaved together and when the successive layers are thin enough that many of them can exhibit simultaneous and coherent X-ray diffraction, the separate peaks characterizing the two individual materials will disappear and be replaced by an average reflection with which are associated satellite peaks. The origin of the satellites is analogous to the superheterodyne effect in radio engineering, where one gets sum-and-difference frequencies known as side bands.

The satellite X-ray peaks which have been observed show a peak at 66.2°. This is the (400) reflection from the GaAs substrate. A peak at 67.5° is the same reflection from the interleaved $GaAs_{1-x}P_x$ layers. Satellite peaks are seen 0.5° above and below this parent peak. Each of the peaks shows a splitting due to the $\alpha_1$ and $\alpha_2$ components of the $CuK_\alpha$ radiation. Both the presence of the satellites and the $\alpha_1$–$\alpha_2$ indicate that the coherence of the superlattice is very good. An analysis of this spectra indicates that for this degree of sharpness to result, the period within the superlattice must be constant to better than 1%.

The above examples illustrate preferred embodiments of the practice of the present invention.

Several advantages which may not be immediately apparent are derived from the practice of the present invention. Firstly, the process of the present invention is an inherently stable and simple one, and control is quite easy. Basically speaking, the present invention is a steady state operation, the only change being that pulses of the $n$th component are injected into the $n-1$ component stream. Thus, there is essentially only one variable to control. It should be noted in this regard that the $n$th component in the examples, that is $PH_3$, never ceases to flow. Rather, $PH_3$ flow merely changes in direction, that is either into the system as a pulse or out to vent.

Although the examples have not disclosed the introduction of donor or acceptor impurities into the superlattice, such is easily accomplished in accordance with the present invention. For instance, amounts of a vaporized "dopant" can be introduced into the system with the $n-1$ components or could actually be mixed with the $n$th component or carrier gas for the $n$th component prior to pulsing. The proportions of impurity are within the ranges used by the prior art. The only important parameter to observe with respect to the impurity used is that it be vaporous at the substrate. Representative impurities completely operable in the present invention are S, Se, Si, Zn, Cd, etc. Others will be apparent to one skilled in the art.

During the practice of the present invention, several unexpected and, to date, unexplainable results have been obtained. Firstly, it was believed prior to conducting a process run that solid state diffusion would occur while the superlattice of the present invention was being formed, since this is a high temperature operation. Due to the extreme thinness of layers, it was felt that it would be impossible to maintain the "maximum" and "minimum" layers separate, i.e., a superlattice could not be formed. For some unexplainable reason, this has not been found to be the case, that is, for some reason solid state interdiffusion does not occur to such an extent so as to destroy the superlattice structure obtainable in accordance with the present invention.

The present invention thus provides both a process and apparatus for forming a superlattice structure wherein the difference between the maximum and minimum values of $x$ is directly a measure of the amplitude of the potential variation, the magnitude of this difference, $\Delta x$, being of great significance to the electrical behavior of the superlattice, in fact, potentially of greater significance than the steepness of the grading. Whether a significance $\Delta x$ can be built into and maintained in the crystal at such close tolerances obviously depends critically on the extent of interdiffusion of the components in the gas phase.

It will be appreciated that the present invention is not limited to the use of the GaAs substrate of the example, nor, in fact, need the substrate be the same as either component of the superlattice. It will further be apparent that while 100–500 A. is a preferred superlattice period (100–300 A. is most preferred), superlattice structures with a greater period, e.g., as high as 1000 A., can be prepared in accordance with the present invention. This is because the basic parameters hereto set forth are essentially physical parameter, i.e., they are based upon the actual process conditions, rather than the selection of any particular set of reaction components.

While the invention has been particularly shown and described with reference to preferred embodiments thereof, it will be understood by those skilled in the art that various changes in form and detail may be made therein without departing from the spirit and scope of the invention.

What is claimed is:

1. A continuous gaseous phase, high temperature process for forming a multi-layer epitaxial superlattice structure comprising alternate layers of different epitaxial material selected from the group consisting of materials represented by the formula $A_xB_{1-x}$ and $AB_xC_{1-x}$ wherein A, B and C represent different elemental components and wherein the value of $x$ in alternate layers of said superlattice varies from a desired maximum to a desired minimum within the bounds $0 \leq x \leq 1$ comprising:

(a) forming a first gaseous stream of substantially constant volume comprising alternate pulses of carrier gas containing one of said elemental components in the form of a member selected from the group consisting of a gaseous element and a gaseous decomposable compound containing said element, said element being selected from the group consisting of Groups IV–A, III–A, V–A, II–B and VI–A of the Periodic Table, separated by pulses of carrier gas initially substantially free of said one component by cyclically injecting said one component into a flowing stream of said carrier gas;

(b) continuously injecting said pulses into a second gaseous stream comprising a carrier gas and the remaining components of said epitaxial material to thereby form alternate gaseous bursts containing all components of said epitaxial material wherein said one component of said first gaseous stream is present at a maximum concentration separated by gaseous bursts wherein said one component of said first gaseous stream is present at a minimum concentration, said remaining components of said epitaxial material being different from said one component present in said first gaseous stream and being in the form of at least one member selected from the group consisting of a gaseous element and a gaseous decomposable compound containing said element, said element being selected from the group consisting of Groups IV–A, III–A, V–A, II–B and VI–A of the Periodic Table and thereafter (c) contacting said gaseous bursts with a substrate to cause deposition of said superlattice structure, the gaseous bursts containing all components of said epitaxial material yielding a layer wherein $x$ is at a maximum, and the gaseous bursts wherein said one component of the first gaseous stream is present at a minimum concentration yielding a layer wherein $x$ is at a minimum, and (d) maintaining a set residence time and interface contact area for said pulses and said bursts to control the degree of diffusion between said alternate pulses and said alternate bursts to provide said superlattice structure, wherein when one element is from Group III–A of the Periodic Table, at least one other element is from Group V–A of the Periodic Table, and wherein when one element is from Group II–B of the Periodic Table, at least one other element is from Group VI–A of the Periodic Table.

2. The process of claim 1 wherein said second gaseous stream comprising the carrier gas and the remaining components of said epitaxial material is formed by mixing the said components with the carrier gas prior to step (b).

3. The process of claim 1 wherein the components initially present in the second gaseous stream are in the form of the decomposable compounds GaCl and $AsH_3$, and the one component initially present in the first gaseous stream is in the form of the decomposable compound $PH_3$, said superlattice comprising alternate layers of the formula $GaAs_{1-x}P_x$, wherein $x$ varies from about 0.16 to about 0.42 in alternate layers.

4. The process of claim 1 wherein $x$ is within the bounds $0 < x < 1$.

5. The process of claim 1 wherein the pulse residence time between pulse formation and injection is from .05 to .3 second, the burst residence time between pulse injection and deposition or burst velocity decrease is from .05 to .3 second, the average interface contact area for said pulses is from .2 to 10 mm.$^2$ and the average interface contact area for said bursts is from .5 to 1.0 cm.$^2$.

6. The process of claim 5 wherein said first gaseous stream of substantially constant volume is produced by cyclically injecting no more than 10% by volume of said one component into said carrier gas of step (a), and said pulses comprise from 10% to 30% by volume of said bursts.

7. The process of claim 6 wherein said one component is cyclically injected into said carrier gas every 0.9 to 90 seconds which comprises one injection cycle, said one component being continuously pulsed into said carrier gas for ¼ to ¾ of the injection cycle to yield a pulse which contains said one element, the balance of the injection cycle thereby yielding a pulse initially substantially free of said one component.

8. The process of claim 7 wherein said one component is cyclically injected every 1 to 10 seconds.

9. The process of claim 7 wherein the total flow rate of all gases is about 1,000 to about 3,000 cm.$^3$/minute.

10. The process of claim 7 wherein said components of said epitaxial material comprise from 0.5 to 2%, by volume, of the total amount of the carrier gas which is hydrogen and wherein the pressure is within the range 0.01 to 2 atmospheres.

11. The process of claim 7 wherein the deposition of said superlattice is at a growth rate of from 2 to 40 microns per hour, and said superlattice has a period of from 100 A. to 500 A.

12. The process of claim 7 wherein said pulses are injected into said bursts and thereafter forwarded to said substrate for deposition at an average burst velocity between deposition or burst velocity decrease of 100 to 300 cm./sec.

13. The process of claim 12 wherein said velocity occurs between burst formation and deposition.

14. The process of claim 12 wherein said velocity occurs between burst formation and burst velocity decrease, whereafter deposition occurs upon a substrate within 0 to 2 cm. of said point of velocity decrease.

15. The process of claim 4 wherein said substrate has a (3,1,1) orientation.

16. A continuous gaseous phase, high temperature process for forming a multi-layer epitaxial superlattice structure comprising alternate layers of different epitaxial material selected from the group consisting of materials represented by the formula $A_xB_{1-x}$ and $AB_xC_{1-x}$ wherein A, B and C represent different elemental components and wherein the value of $x$ in alternate layers of said superlattice varies from a desired maximum to a desired minimum within the bounds $0 \leqq x \leqq 1$ at a superlattice period of from about 100 A. to about 500 A. comprising:

(a) forming a first gaseous stream of substantially constant volume comprising alternate pulses of carrier gas containing one component of said epitaxial material in the form of a member selected from the group consisting of a gaseous element and a gaseous decomposable compound containing said element, said element being selected from the group consisting of Groups IV–A, III–A, V–A, II–B and VI–A of the Periodic Table, separated by pulses of carrier gas initially substantially free of said one component by cyclically injecting said one component into a flowing stream of said carrier gas, said one component being cyclically injected into said carrier gas every 1.0 to 10 seconds which comprises one injection cycle, said one component being continuously pulsed into said carrier gas for ¼ to ¾ of the injection cycle to yield a one component containing pulse, the balance of the injection cycle thereby yielding a pulse initially substantially free of said one component, said one component comprising from about 1 to about 10% by volume of said carrier gas, (b) continuously injecting said pulses into a second gaseous stream comprising a carrier gas and the remaining components of said epitaxial material to thereby form alternate gaseous bursts containing all components of said epitaxial material wherein said one component of said first gaseous stream is present at a maximum concentration separated by gaseous bursts wherein said one component of said first gaseous stream is present at a minimum concentration, said remaining components of said epitaxial material being different from said one component present in said first gaseous stream and being in the form of a member selected from the group consisting of a gaseous element and a gaseous decomposable compound containing said element, said element being selected from the group consisting of Groups IV–A, III–A, V–A, II–B and VI–A of the Periodic Table, said pulses comprising from about 10% to about 30%, by volume, of said bursts, (c) passing said bursts to a deposition zone at an average gas velocity of from 100 to 300 cm./sec. to either deposition or burst velocity decrease, and (d) thereafter contacting said gaseous bursts with a substrate to cause deposition of said superlattice structure, thereby depositing said epitaxial superlattice structure at a growth rate of $2\mu$ to $40\mu$ per hour, the gaseous burst containing all components of said epitaxial material yielding a layer wherein $x$ is at a maximum, and the gaseous bursts wherein said one component of the first gaseous stream is present at a minimum concentration yielding a layer wherein $x$ is at a minimum, wherein:

the system pulse residence time between pulse formation and pulse injection is .05 to .3 second, the burst residence time between injection and deposition or burst velocity decrease is .05 to .3 second, the average interface contact area for said pulses is 2 to 10 $mm.^2$ and the average interface contact area for said burst is .5 to 1.0 $cm.^2$, the components of said epitaxial material comprise from 0.5 to 2% by volume of said carrier gas;

the total gas flow is 1,000 to 3,000 $cm.^3$/minute; and the pressure is about 1 atmosphere;

wherein when one element is from Group III–A of the Periodic Table, at least one other element is from Group V–A of the Periodic Table, and wherein when one element is from Group II–B of the Periodic Table, at least one other element is from Group VI–A of the Periodic Table.

17. The process of claim 16 wherein said second gaseous stream comprising the carrier gas and the remaining components of said epitaxial material is formed by mixing the components with the carrier gas prior to cyclically injecting said pulses thereinto.

18. The process of claim 16 wherein the substrate upon which deposition occurs has a (3,1,1) orientation.

References Cited

UNITED STATES PATENTS

| | | | |
|---|---|---|---|
| 3,576,670 | 4/1971 | Hammond | 117—107 |
| 3,441,453 | 4/1969 | Conrad et al. | 117—106 A |
| 3,322,575 | 5/1967 | Ruehrwein | 136—89 |
| 3,333,982 | 8/1967 | Horn et al. | 117—106 R |

ALFRED L. LEAVITT, Primary Examiner

C. K. WEIFFENBACH, Assistant Examiner

U.S. Cl. X.R.

117—106 A; 148—175; 317—235 AC